310-335 SR

4/21/87 OR 4,659,956

United States Patent [19]

Trzaskos et al.

[11] Patent Number: 4,659,956

[45] Date of Patent: Apr. 21, 1987

[54] COMPOUND FOCUS ULTRASONIC TRANSDUCER

[75] Inventors: Casmir R. Trzaskos, Amsterdam; John D. Young, Rexford, both of N.Y.

[73] Assignee: General Electric Company, Schenectady, N.Y.

[21] Appl. No.: 847,998

[22] Filed: Apr. 3, 1986

Related U.S. Application Data

[63] Continuation of Ser. No. 694,581, Jan. 24, 1985.

[51] Int. Cl.[4] .......... H01L 41/08

[52] U.S. Cl. .......... 310/335; 310/327; 310/369

[58] Field of Search .......... 310/334–337, 310/327, 367, 369; 73/642, 644; 367/150

[56] References Cited

U.S. PATENT DOCUMENTS

| | | | |
|---|---|---|---|
| 4,001,766 | 1/1977 | Hurwitz | 310/335 X |
| 4,016,751 | 4/1977 | Kossoff | 73/642 X |
| 4,184,094 | 1/1980 | Kopel | 310/335 |
| 4,382,201 | 5/1983 | Trzaskos | 310/327 |
| 4,440,025 | 4/1984 | Hayakawa et al. | 73/642 |
| 4,445,380 | 5/1984 | Kaminski | 310/335 X |
| 4,535,630 | 8/1985 | Samodovitz | 310/335 X |

*Primary Examiner*—Mark O. Budd

*Attorney, Agent, or Firm*—Donald R. Campbell; James C. Davis, Jr.; Paul R. Webb, II

[57] ABSTRACT

Improved focussing and increased bandwidth is obtained in a single-element ultrasonic transducer for nondestructive evaluation and material characterization applications. The piezoelectric ceramic element has a radius of curvature $R_1$, and a combination lens and cover layer on its front surface has a radius of curvature $R_2$ which is less than $R_1$. The depth of field of the transducer is increased and the bandwidth improved; the total thickness of the lens may be selected to control bandwidth.

2 Claims, 3 Drawing Figures

COMPOUND FOCUS ULTRASONIC TRANSDUCER

This application is a continuation of application Ser. No. 694,581 filed Jan 24, 1985.

BACKGROUND OF THE INVENTION

This invention relates to ultrasonic transducers and especially to obtaining improved focussing and increased bandwidth in a single-element device.

Transducers are focussed by the use of a lens or by bending the piezoelectric element so as to direct the ultrasonic energy to a point. In the former category are buffer rod transducers which have a large lens made of quartz or some other suitable material. While this technique does provide a high degree of focussing, the thick lens introduces undesirable reflections of the sonic beam which interfere with the received signal.

SUMMARY OF THE INVENTION

An object of the invention is to improve the degree of focussing over a longer axial range in an ultrasonic transducer while avoiding the problems inherent in a lens-focussed transducer.

Another object is the provision of increased bandwidth as well as increased depth of field in such a single-element transducer.

The improved compound focus ultrasonic transducer is comprised of a one-piece spherically curved piezoelectric element which has a radius of curvature $R_1$ and metallic electrodes on the front and back surfaces, a lens bonded to the front surface that serves as a cover layer and impedance matching layer, and a sound absorbing backing bonded to the back surface. The lens has a radius of curvature $R_2$ which is less than $R_1$ and a thickness at its center of about one-quarter wavelength at the preassigned center frequency of the transducer. Alternatively the lens may have a non-spherical curvature but is thicker at the edges than at the center and has a uniformly increasing thickness. Such a transducer has an increased depth of field and an increased bandwidth; the total thickness of the lens can be selected to modify the bandwidth. One device has a modified sodium niobate ceramic element, a cast epoxy lens, and a tungsten-PVC composite backing.

The improved ultrasonic transducer is useful in C-scanning and in non-destructive evaluation and material characterization applications.

DETAILED DESCRIPTION OF THE INVENTION

Figure 1:
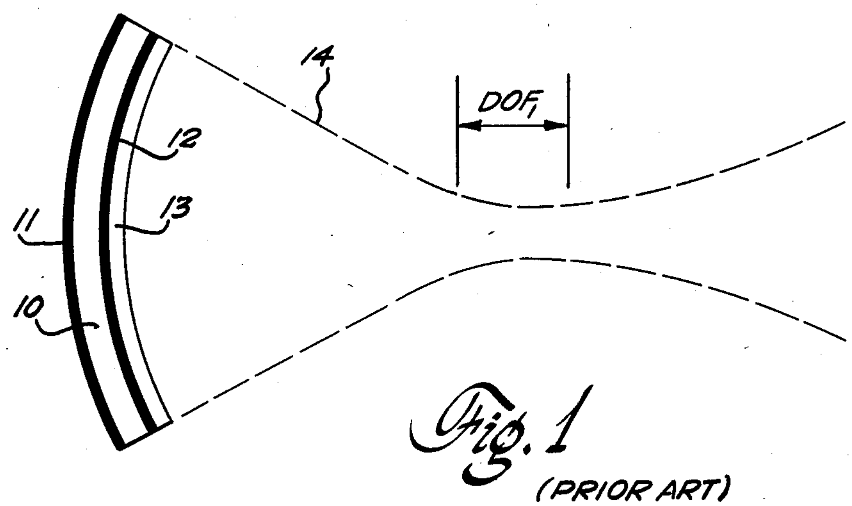
Fig. 1 (PRIOR ART)
FIG. 1 shows the depth of field of a prior art focussed transducer having a uniform thickness cover layer.

The high frequency single-element focussed transducer in prior art FIG. 1 is comprised of a spherically curved, piezoelectric ceramic element 10 which has a radius of curvature $R_1$ and metallic electrodes 11 and 12 on both surfaces. The thin cast epoxy cover layer 13 on the element has a uniform thickness. The beam pattern 14 of the transducer exhibits a narrowed focal zone over which the object, such as a metal workpiece in a water bath, is relatively uniformly insonified. The depth of field ($DOF_1$) is indicated; in this region the amplitude of focussed ultrasonic energy varies less than, say, 1 dB, and is almost uniform. One reference that shows such an ultrasonic transducer is C. R. Trzaskos U.S Pat. No. 4,382,201.

Figure 2:
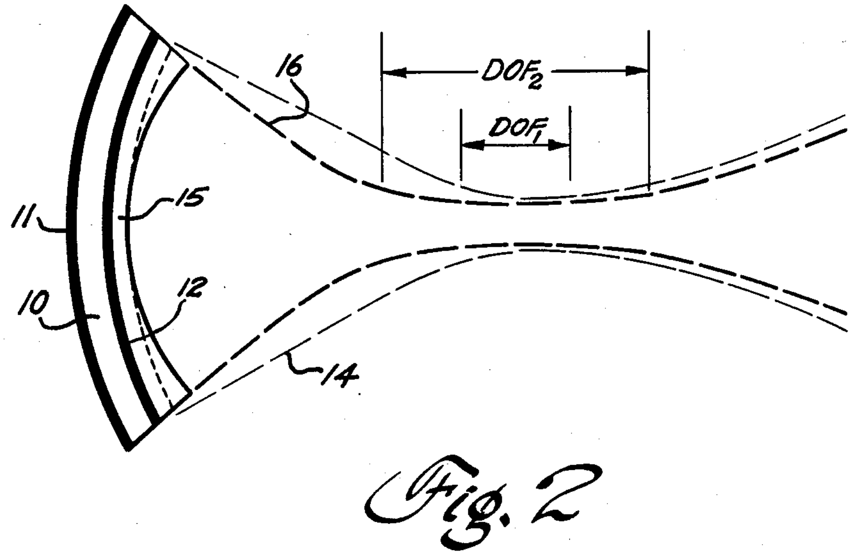
FIG. 2 illustrates, in dark lines, the improved ultrasonic transducer with its larger depth of field, compared to the prior art device shown in light lines.

FIG. 2 shows in dark lines the improved compound focus ultrasonic transducer, contrasted to the prior art transducer in light lines with a uniform thickness cover layer, and the increased depth of field and improvement in focussing. The combination spherical lens and cover layer 15 on the front surface of piezoelectric ceramic element 10 has a radius of curvature $R_2$ which is less than the radius of curvature $R_1$ of the element. The beam pattern 16 of the compound focussed transducer and the longer depth of field $DOF_2$ is contrasted to the beam pattern 14 and shorter depth of field of the prior art transducer. The axial distance of the uniformly insonified region is extended. Fairly large differences in curvature can be employed resulting in a focussed beam over a longer axial range. For instance, the radii of the element and lens may be 14 and 7 inches, a factor of 2.

The lens/cover layer 15 also serves as an impedance matching layer. Its thickness at the center is adjusted to be one-quarter wavelength or a little less at the known center frequency of the transducer. Such a transducer has an increased or wider bandwidth which results in better resolution along the depth. If the center of the lens/cover layer 15 has a thickness of one-quarter wavelength, the thicker portions of the lens near the edge couple more strongly to the lower frequency components of the acoustic energy resulting in an increased bandwidth for the device. When the thickness at the center is set less than one-quarter wavelength, up to 20% less, the thinner portions of the lens near the center couple more strongly to the higher frequency components of the transmitted ultrasound. The total thickness of the lens is selected to control the bandwidth of the transducer. It is understood that the ceramic element is chosen to get the desired center frequency, and the foregoing variation in thickness of the lens/cover layer modifies the bandwidth. The lens, nominally thicker at the edges than at the center and having a uniformly increasing thickness, could have a non-spherical curvature to modify the bandwidth of the acoustic beam.

Figure 3:
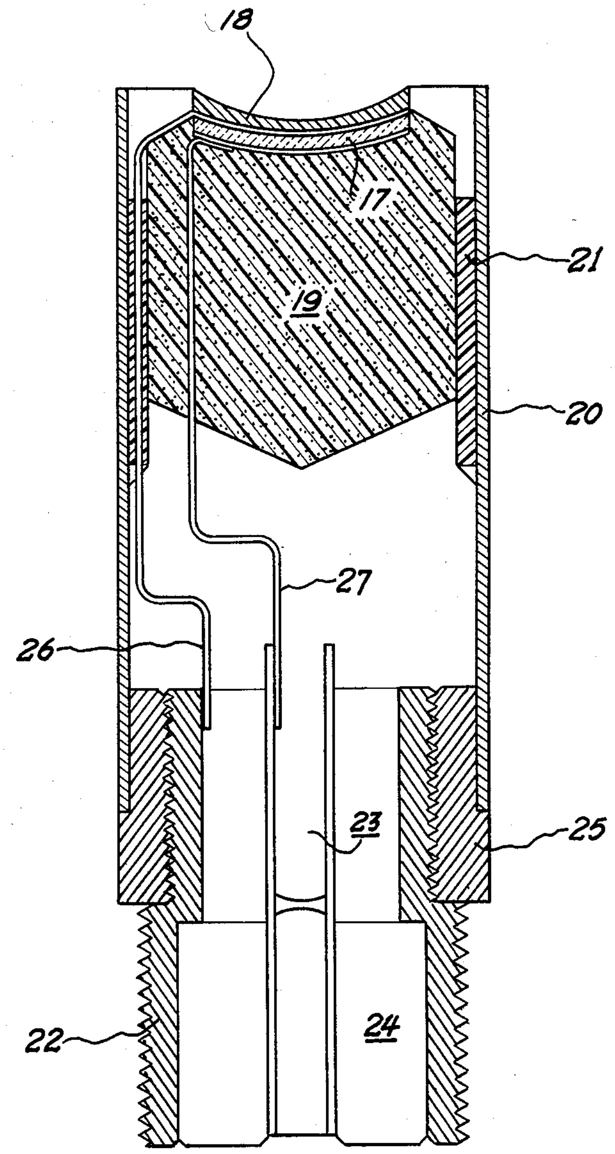
FIG. 3 is a vertical cross section through the complete compound focus ultrasonic transducer assembly.

The high frequency C-scan transducer assembly in FIG. 3 is useful in non-destructive evaluation and material characterization applications. Both 5 MHz and 25 MHz units have been built and operated successfully. The one-piece, spherically curved, piezoelectric ceramic transducer element 17 is bonded to the backing 19 to conform to the ground surface having a radius of curvature $R_1$. A further increase in focussing is obtained by casting the lens/cover layer 18 to a radius $R_2$, which is less than $R_1$. The ceramic is modified sodium niobate and the room temperature curing epoxy is Emerson & Cummings No. 27. The backing 19, which absorbs sound coming off of the back of the element, is typically a tungsten-polyvinyl chloride composite. The cylindrical backing member 19 is spaced from the metal case 20 by a plastic sleeve 21. An RF connector having outer and center conductors and insulation 22–24, is screwed into the base 25 of the case. Electrical leads 26 and 27 connect the top and bottom electrodes of transducer element 17 with the ground and center conductors.

The double curvature, compound focussed ultrasonic transducer can be made with piezoelectric elements of lead metaniobate, lead zirconium titanate, and lithium niobate. In the case of the latter two ceramic materials, adjustment of the lens/cover layer material may be needed. Further, the invention is for any high frequency range and not limited to the megahertz frequencies that were mentioned.

While the invention has been particularly shown and described with reference to preferred embodiments thereof, it will be understood by those skilled in the art that various changes in form and details may be made without departing from the spirit and scope of the invention.

What is claimed is:

1. A compound focus C-scan ultrasonic transducer comprising:

a single, one-piece piezoelectric ceramic transducer element spherically curved to focus ultrasonic energy and having a radius of curvature $R_1$ and metallic electrodes on the front and back surface thereof to which electrical leads are connected:

a sound absorbing backing bonded to said back surface; and means consisting of an epoxy layer bonded to said front surface that has a radius of curvature $R_2$ which is less than $R_1$ and serves as a coveer layer for said transducer, a lens to improve the focusing and result in an increased depth of field, and an impedance matching layer having a thickness at the center between one-quarter wavelength at the preassigned transducer center frequency and up to 20% less than one-quarter wavelength, thereby resulting in an increased bandwidth.

2. The ultrasonic transudcer of claim 1 wherein said ceramic transducer element is modified sodium niobate and said backing is tungsten-polyvinylchloride composite.

* * * * *